United States Patent
Dagan

(10) Patent No.: US 10,498,232 B1
(45) Date of Patent: Dec. 3, 2019

(54) SILICON-OXIDE-NITRIDE-OXIDE-SILICON (SONOS) VOLTAGE MULTIPLIER

(71) Applicant: Lior Dagan, Edinburgh (GB)

(72) Inventor: Lior Dagan, Edinburgh (GB)

( * ) Notice: Subject to any disclaimer, the term of this patent is extended or adjusted under 35 U.S.C. 154(b) by 0 days.

(21) Appl. No.: 16/025,277

(22) Filed: Jul. 2, 2018

(51) Int. Cl.
  *H01L 29/51* (2006.01)
  *H01L 29/792* (2006.01)
  *H02M 3/07* (2006.01)

(52) U.S. Cl.
  CPC .......... *H02M 3/073* (2013.01); *H01L 29/513* (2013.01); *H01L 29/518* (2013.01); *H01L 29/792* (2013.01); *H02M 2003/075* (2013.01)

(58) Field of Classification Search
  CPC ... H01L 29/513; H01L 29/518; H01L 29/792; H02M 3/073; H02M 2003/075
  USPC .......... 327/117, 118, 119, 122, 536
  See application file for complete search history.

(56) References Cited

U.S. PATENT DOCUMENTS

| | | | |
|---|---|---|---|
| 6,418,040 B1 * | 7/2002 | Meng ........................ | F28D 5/00 307/109 |
| 6,842,327 B1 * | 1/2005 | Diorio ................. | H01L 27/0805 257/E27.048 |
| 2005/0030087 A1 * | 2/2005 | Guo ...................... | H02M 3/073 327/536 |
| 2013/0141978 A1 * | 6/2013 | Hirose ............... | G11C 16/0466 365/185.18 |

* cited by examiner

*Primary Examiner* — William Hernandez
(74) *Attorney, Agent, or Firm* — Pearl Cohn Zedek Latzer Baratz LLP

(57) ABSTRACT

A method and a system for DC-to-DC conversion are provided herein. The system may include a direct current to direct current (DC-to-DC) converter which may include at least one silicon-oxide-nitride-oxide-silicon (SONOS) device operable to perform voltage multiplication. The method may include directionally altering the threshold voltage of at least one silicon-oxide-nitride-oxide-silicon (SONOS) device, including applying a positive or negative voltage to at least a gate region of said at least one SONOS device thereby forcing electrons or holes from a channel region in said SONOS device to tunnel through an oxide layer (SiO), become trapped in silicon nitride (SiN), and accumulate proximate to a source region and/or a drain region in said at least one SONOS device, said accumulated electrons or holes altering the threshold voltage of said at least one SONOS device in a direction of said source or said drain region.

15 Claims, 14 Drawing Sheets

SILICON-OXIDE-NITRIDE-OXIDE-SILICON (SONOS) VOLTAGE MULTIPLIER

FIELD OF THE INVENTION

The present invention relates generally to microelectronics, and more particularly, to voltage multiplication devices.

BACKGROUND OF THE INVENTION

The use of metal-oxide-semiconductor (MOS) devices has long been observed in microprocessors, microcontrollers, static RAM, and other digital logic circuits. This can be unsurprising given that MOS devices typically boast high noise immunity and low static power consumption. The physical 'metal-oxide-semiconductor' structure of MOS devices can be a reference to the structure of certain field-effect transistors (FET) where a metal gate electrode is disposed on top of an oxide insulator and where the oxide insulator can reside on top of a semiconductor material.

FETs are typically unipolar transistors that utilize an electric field to control electrical behavior and can involve single-carrier-type operation. The conductivity of a FET between the drain and source terminals can be controlled by an electric field. The electric field can be generated by the voltage difference between the source and gate of the device.

Metal-oxide-semiconductor field-effect transistors (MOSFET) are typically a type of field-effect transistor and typically comprise an insulated gate where the voltage applied to the gate can determine the conductivity of the device. The ability to vary the conductivity of a MOSFET device can render MOSFETs particularly suited to, for example, amplifying or switching electronic signals.

It will be appreciated that extrinsic and/or 'doped' semiconductor devices can be prevalent in the art. A 'doped' semiconductor device can refer to a semiconductor where a doping agent has been introduced to differ the electrical properties of the semiconductor to mimic electrical properties of an intrinsic or 'pure' state. Doping can be achieved through the addition of atoms, also typically referred to as impurities, which can change electron and hole carrier concentrations of the semiconductor at thermal equilibrium. The dominant carrier concentration in an extrinsic semiconductor can define whether the semiconductor is an n-type or p-type semiconductor, where an n-type semiconductor typically has a larger electron concentration and a p-type semiconductor typically has a larger hole concentration.

In some FETs, for example an n-channel enhancement mode transistor, a conductive channel typically is not created during manufacturing and a gate-to-source voltage is typically necessary to create the conductive channel. The application of a positive voltage between the gate and the source can act to attract free-floating electrons within the FET towards the gate forming a conductive channel Typically, sufficient electrons are first attracted near the gate to counter dopant ions in the FET and this can occur with the formation of a depletion region. A depletion region can be a region where mobile charge carriers have been forced away by an electric field leaving substantially only ionized donor or acceptor impurities.

The voltage at which a depletion region forms in an FET can be referred to as the threshold voltage of that FET. This can be the minimum gate-to-source voltage differential that can be required to, for example, create a conducting path between source and drain terminals. Notably some other FETs, such as n-channel or p-channel depletion mode FETs, can have pre-existing conductive channels. In such other FETs, the voltage threshold can denote the voltage level at which the conductive channel is wide enough to allow majority carriers to flow easily.

A voltage multiplier can be an electric circuit which typically converts AC electrical power from a lower base voltage to a higher DC voltage using, for example, a network of capacitors and/or diodes. In voltage multipliers, the periodic direction cycling of AC electric power can be aligned with specifically orientated diodes to, for example, selectively charge a series of capacitors in succession. The number of capacitors used in a voltage multiplier can dictate a peak voltage obtainable with the multiplier.

A DC-to-DC converter can be an electric circuit capable of converting a source of DC electric power from one voltage level to another. One type of DC-to-DC converter is a charge pump which can use capacitors as energy-storage elements to achieve a higher or lower voltage power source. Unlike typical AC voltage multipliers, charge pumps can feature a switching device to, for example, control connection to the capacitors. By way of example, a simple two-stage charge pump may in its first stage feature a capacitor connected across a supply until it is charged to the voltage of said supply. In the second stage the switching device can reconfigure the circuit such that the capacitor is placed in series with the supply to the load. In the absence of non-ideal effects, the function of this circuit can be to double the voltage supplied to the load.

The Dickson charge pump, or Dickson multiplier, is a type of DC-to-DC converter arrangement. As is understood by one of ordinary skill in the art, the ideal output voltage from a Dickson multiplier is typically unachievable. The threshold voltage of the DC-DC converter is typically known to contribute to a reduction in ideal voltage output, and there can be parasitic capacitances at or between each component in the converter. An increase in switching clock frequency can ameliorate output voltage drops and can further reduce the size of the capacitors that can be needed due to, for example, a reduction in charge stored per cycle. An increased clock frequency can eventually lead to losses due to, for example, stray capacitance and/or other imperfections. Clock frequency increases can be beneficial to a point.

Dickson multipliers are typically used in integrated circuits where it is desired to increase a voltage battery supply that is lower than the voltage needed by the circuit to function. Such integrated circuits are typically designed to feature MOSFET(s) that are wired to behave like diodes rather than diodes themselves. As diode wired MOSFETs do not typically work well at very low voltages, more complex circuits are often used to overcome this deficiency. One such example features a second MOSFET connected in parallel with the switching MOSFET biased to its linear region. In this example, this second MOSFET has a lower drain-source voltage than the switching MOSFET has on its own and acts to increasing output voltage.

SONOS, or Silicon-Oxide-Nitride-Oxide-Silicon, can be commonly used as non-volatile computer memory and can be a charge trap flash variant. SONOS can be distinguished from other types of flash and MOSFETs because of its typical use of silicon nitride film as opposed to polycrystalline silicon that can be used. The use of silicon nitride film for charge storage can confer numerous advantages over polycrystalline silicon, including improved reliability and/or higher yield due to a reduced susceptibility to defects in the tunnel oxide layer.

It is therefore an object of embodiments of the invention to incorporate SONOS devices into voltage multiplier or charge pump circuits. It is a further objective of embodiments of the invention to directionally alter the threshold voltage of SONOS devices in a single direction, as explained herein, to achieve additional efficiency improvements.

SUMMARY OF THE INVENTION

Some embodiments of the invention provide a method and a system for DC-to-DC conversion. The system may include a direct current to direct current (DC-to-DC) converter, said converter comprising: at least one silicon-oxide-nitride-oxide-silicon (SONOS) device operable to perform voltage multiplication. The method may include directionally altering the threshold voltage of at least one silicon-oxide-nitride-oxide-silicon (SONOS) device, comprising: applying a positive or negative voltage to at least a gate region of said at least one SONOS device thereby forcing electrons or holes from a channel region in said SONOS device to tunnel through an oxide layer (SiO), become trapped in silicon nitride (SiN), and accumulate proximate to a source region and/or a drain region in said at least one SONOS device, said accumulated electrons or holes altering the threshold voltage of said at least one SONOS device in a direction of said source or said drain region.

These and other advantages of embodiments of the invention are set forth in detail in the following description.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
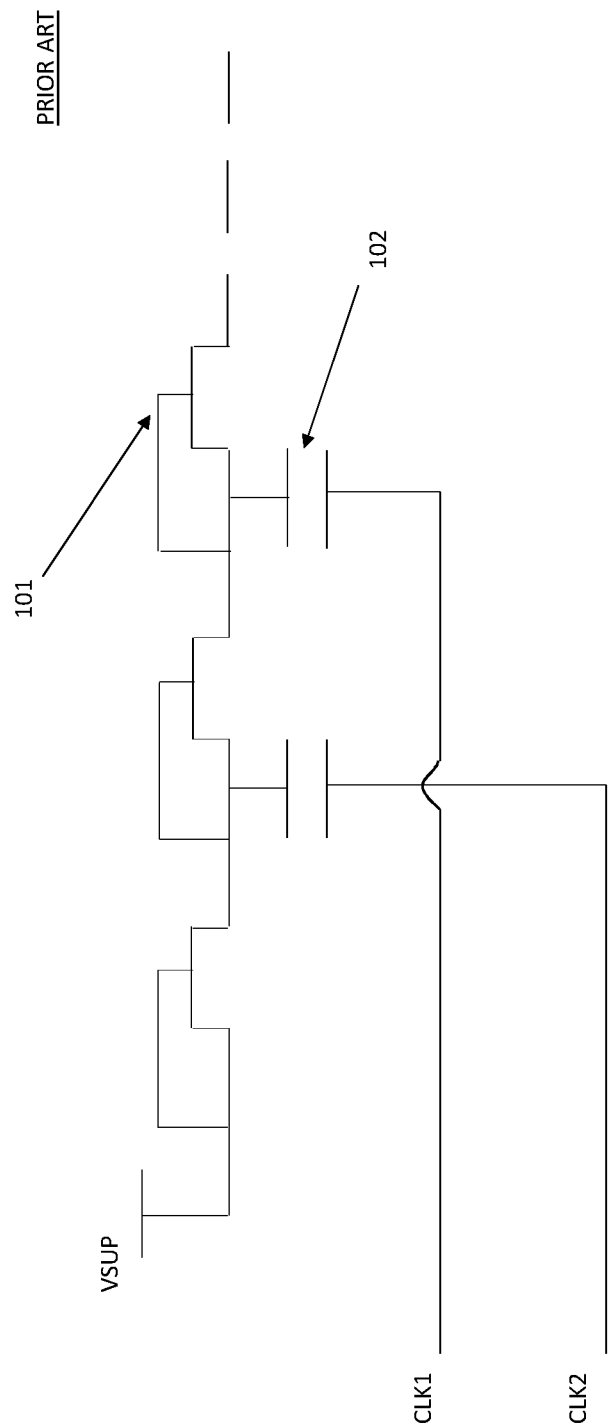
FIG. 1 depicts the circuit diagram of a standard three-stage Dickson multiplier where feedback and control circuitry are not shown, in accordance with the prior art.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

With specific reference now to the drawings in detail, it is stressed that the particulars shown are for the purpose of example and solely for discussing the preferred embodiments of the present invention, and are presented in the cause of providing what is believed to be the most useful and readily understood description of the principles and conceptual aspects of the invention. In this regard, no attempt is made to show structural details of the invention in more detail than is necessary for a fundamental understanding of the invention. The description taken with the drawings makes apparent to those skilled in the art how the several forms of the invention may be embodied in practice.

Before explaining the embodiments of the invention in detail, it is to be understood that the invention is not limited in its application to the details of construction and the arrangement of the components set forth in the following descriptions or illustrated in the drawings. The invention is applicable to other embodiments and may be practiced or carried out in various ways. Also, it is to be understood that the phraseology and terminology employed herein is for the purpose of description and should not be regarded as limiting.

SONOS devices may be 'doped' with electrons or holes, otherwise known as donors or acceptors, to render them extrinsic. Where electrons or holes are injected, for example via a process known as hot-channel/hot-carrier injection (HCl), into an 'edge' of a SONOS device as will be explained in further detail, the threshold voltage of that SONOS device may be decreased or increased in a single direction.

The lower the threshold voltage of a MOS device, typically the better it transmits current from capacitors in a multiplier circuit. Conversely, a lower threshold voltage may be found to exponentially increase leakage and reverse current. The efficiency gains of a reduced threshold voltage may therefore be compromised by reverse currents or, where one increases switching frequency, by stray capacitance. The use of SONOS with a directionally tailored threshold voltage may allow for current drive to be higher in just one direction, such as, for example, on the side of the source. Conversely, reverse currents from the output to the supply, or from higher stages to lower stages, may not benefit from a directionally reduced threshold voltage.

FIG. 1 is a circuit diagram of a standard three-stage Dickson multiplier according to known prior art. A Dickson multiplier is a type of DC-to-DC converter generally intended for low-voltage purposes. The circuit in FIG. 1 comprises two non-overlapping clock pulse trains denoted CLK1 and CLK2 respectively. In operation, low input voltage VSUP may be sequentially connected to charge a series of three capacitors 102. Specifically, when feed pulse CLK1 is low, the first in a series of diode-wired MOSFETs 101 may charge the first in the series of two capacitors 102. As feed pulse CLK1 goes high, the top plate of the first capacitor may be charged to 2VSUP. The first diode-wired MOSFET may then be switched off and the second may be turned on to charge the second capacitor to 2VSUP. In the second cycle, CLK1 may again go low, CLK2 may go high, and the top plate of the second capacitor may be charged to 3VSUP. This process of passing and amplifying charge up the chain may be continued in line with the number of capacitor-MOSFET chains present in the circuit.

It will be appreciated by those skilled in the art that the ideal output of a Dickson multiplier may be nVSUP, where 'n' denotes the total number of capacitor-MOSFET chains. In practice, this ideal output is typically unachievable due to various output reducing factors. One such factor may be the threshold voltage (VT) of the switching device. Where the multiplier is used over 'n' chains, the voltage required to power the switching device may be at least nVT, hence the ideal output may be reduced by at least nVT. Another factor may be that of parasitic capacitances developing at or between each component in the circuit. These capacitances may act as voltage dividers with the storage capacitors in the circuit and may act to further reduce output voltage. An increase in switching clock frequency may reduce electrical ripple in the circuit and may further render any residual ripple easier to filter. A higher clock frequency also, in turn, may reduce the size of capacitors needed in the circuit as less charge may be stored per cycle. An increased clock frequency may, however, lead to additional parasitic capacitance effect. There may therefore be a practical limit to the benefits obtainable from increased clock frequency, generally in the region of a few hundred kilohertz to a few megahertz.

Given the aforementioned limitations, it is an objective of embodiments of the invention to improve upon voltage multiplier circuits through use of SONOS. It will be appreciated that SONOS is typically formed from a standard polysilicon MOSFET transistor with the addition of a small quantity of silicon nitride inserted inside the transistor's gate oxide. This small quantity of silicon nitride is generally non-conductive but may contain many trapping sites capable of holding electrostatic charge, and charge stored on the silicon nitride may affect the conductivity of the underlying transistor channel. When the polysilicon control gate is positively or negatively biased, electrons or holes from the source and drain regions may tunnel through the oxide layer and become trapped in the silicon nitride. The presence of these trapped electrons or holes may generate an energy barrier between the drain and source, possibly altering the threshold voltage. Notably trapped electrons or holes may be removed from the silicon nitride when an opposing bias is applied to the control gate.

Figure 2:
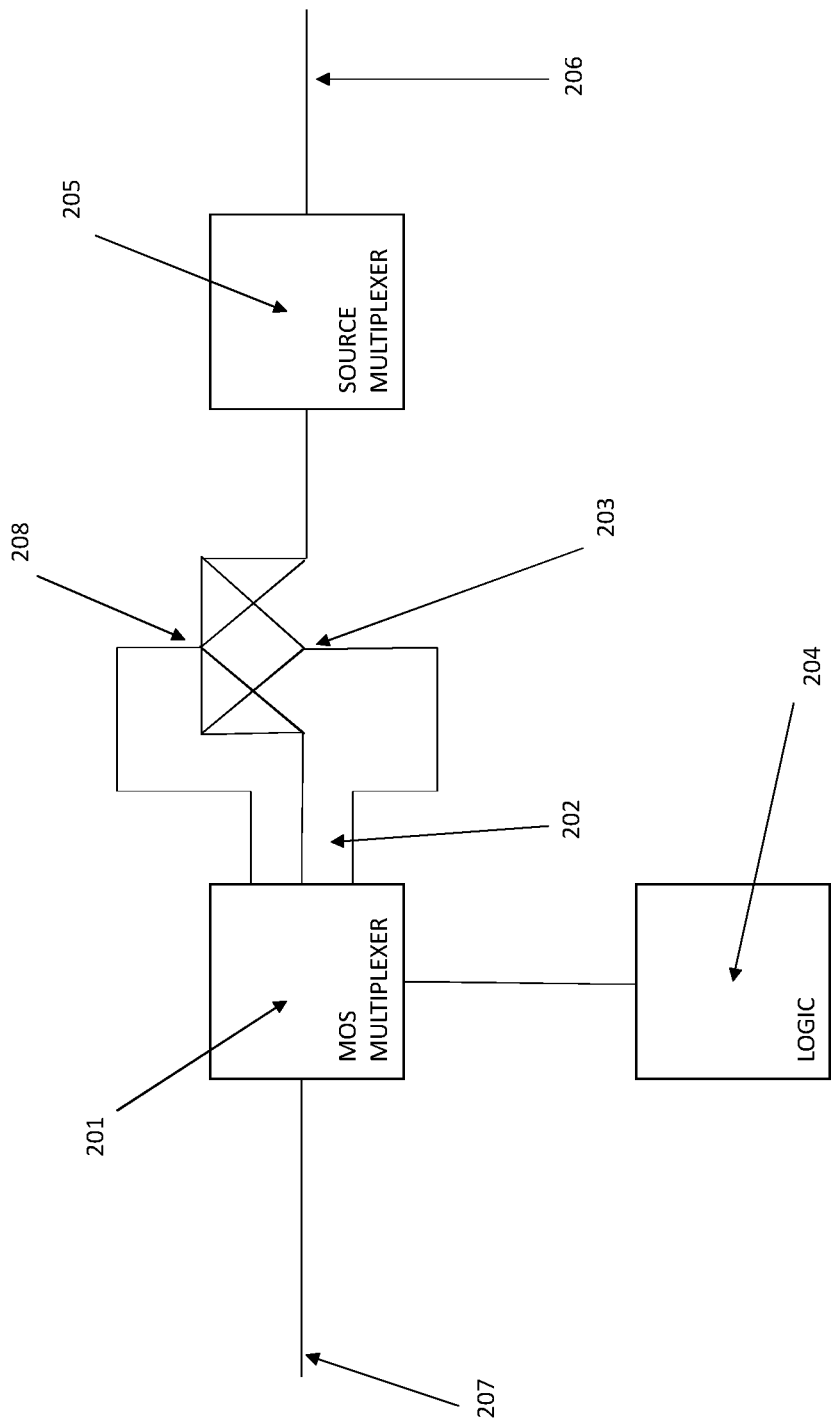
FIG. 2 is a circuit diagram illustrating an example of mode switching control circuitry for use with a SONOS directional multiplier according to an embodiment of the present invention.

FIG. 2 illustrates an example of switching control circuitry which may be used in a SONOS multiplier circuit. The example circuitry comprises a standard Gate, Bulk, Drain (G, B, D) MOS multiplexer 201 connected to at least one gate 208 where the multiplexer may provide for at least two distinct modes of operation, namely erasure/program mode and normal operation mode. It will be appreciated by those skilled in the art that erasure/program mode must typically be run before a SONOS multiplier device may be utilized in a high efficiency manner. As the formation of an energy barrier generally occurs when electrons or holes become trapped in the silicon nitride, the absence of a current flow through the device may indicate the presence of trapped electrons or holes.

The example circuitry further features drain connection 202, logic or bias 204 for controlling multiplexer 201 and establishing mode of operation, a source multiplexer 205, and bulk connection 203. It will be appreciated by those skilled in the art that connection 207 may be representative of a collection of nodes and for each of G, B, D may connect to external erasure/program biases or to a 'normal left side' connection. Accordingly, for drain and gate it may be connected to either the supply of the circuit, or to the output of the previous stage. For bulk it may be connected to ground or to a virtual short for n-type, or supply for p-type. Connection 207 may also feature additional devices operable to shield normal devices from erasure/program voltage levels. Connection 206 is similar to that of connection 207, with the exception of connecting to source rather than G, B, D, and may contain shielding for the coupling capacitors.

It will be appreciated by those skilled in the art that multiplexer 201 may be operable to protect coupled capacitors and other circuitry in the SONOS multiplier circuit from too high or low voltages when erasure/program mode is implemented. Additional auxiliary charge-pumps may be included in the circuitry for the purposes of driving the multiplexer device gates when in erasure/program operation mode. In such circumstances, the gates may be driven to very high voltage values on n-type MOS and very low voltage values on p-type MOS. These auxiliary pumps may also be used to supply the voltages needed for erasure/program operations to be performed. The inclusion of multiplexer driving auxiliary pumps may confer advantages in that they may act to minimize voltage drain to source drops by ensuring very high inversion during normal/high efficiency operation. They may also minimize the required W/L of the multiplexer devices, which in turn may minimize parasitic capacitance, and reduce area. Notably these auxiliary charge pumps may or may not include SONOS elements and, as they only drive gate capacitance, may be of minimal area and/or power consumption. The auxiliary charge-pumps may also be used to directionally alter the threshold voltage of the SONOS, albeit such a process may necessitate larger area and/or power consumption.

Embodiments of the invention may be used to achieve reductions in voltage, which is to say that the input voltage may be multiplied by a value less than one, and may also be used to achieve buck-boost operation. Arrangements where the multiplication value is less than one are typically referred to as a 'step-down' multiplier. Accordingly, embodiments of the invention may be used for step-up/step-down multiplication, where switching may be required, however for maximum efficiency it will be appreciated by those skilled in the art that one side of the switch should typically be no lower than the other side during operation. Embodiments of the invention may also be used for ultra-low supply-voltage multipliers, for example those using capacitive boost techniques in their clock generators.

Figure 3:
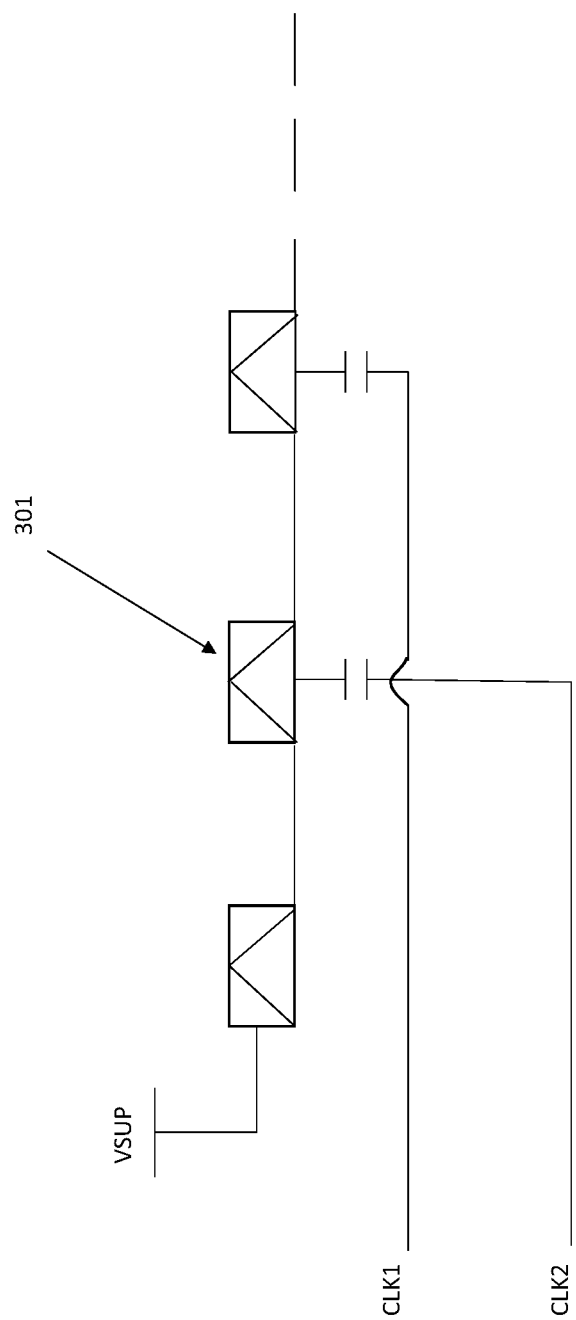
FIG. 3 shows an example of a circuit diagram depicting a three-stage n-type or positive SONOS directional multiplier according to an embodiment of the present invention where feedback and control circuitry are not shown.

FIG. 3 shows an example of a three-stage n-type or positive SONOS directional multiplier according to an embodiment of the invention where the feedback and control circuitry of FIG. 2 is not shown. It will be appreciated by those skilled in the art that the depicted n-type SONOS devices 301 may have been 'doped' so that the majority charge carriers are electrons. Such a 'doping' process may be achieved by injecting donor atoms into each silicon device. Appropriate donor atoms may include phosphorus, arsenic or antimony, however other such atoms may be considered by those skilled in the art. The 'doped' n-type SONOS devices 301 may each have lowered or increased threshold voltage in a single direction, as described herein.

Figure 4:
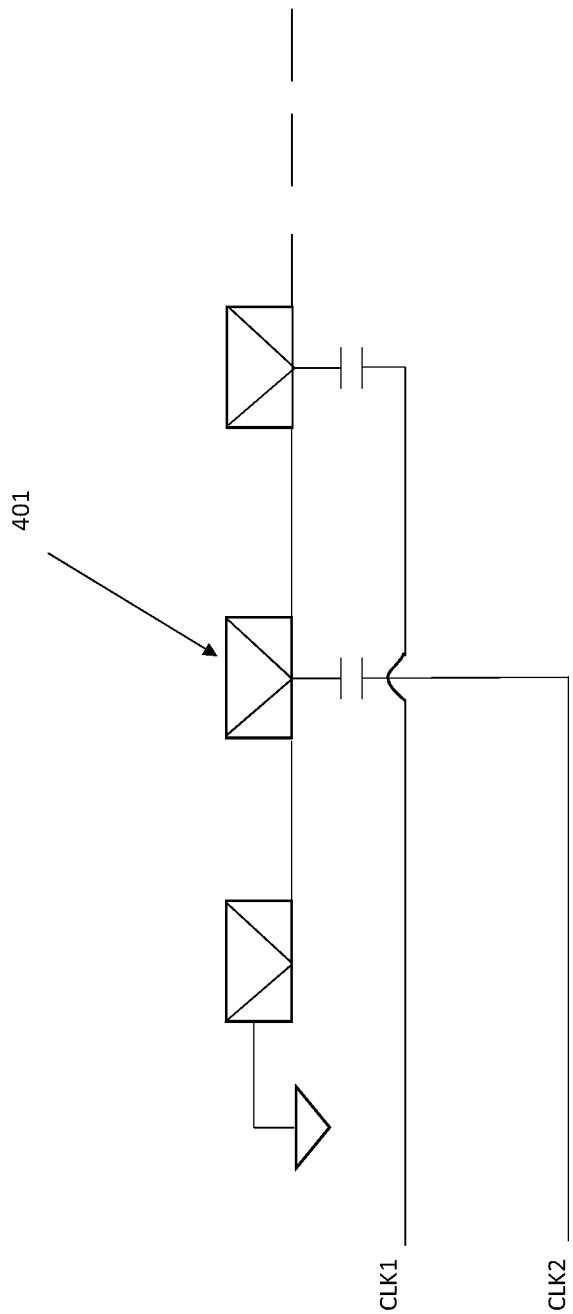
FIG. 4 shows an example of a circuit diagram depicting a three-stage p-type or negative SONOS directional multiplier according to an embodiment of the present invention where feedback and control circuitry are not shown.

FIG. 4 shows an example of a three-stage p-type or negative SONOS directional multiplier according to an embodiment of the invention where the feedback and control circuitry of FIG. 2 is not shown. It will be appreciated by those skilled in the art that the depicted p-type SONOS devices 401 may have been 'doped' so that the majority charge carriers are holes. Such a 'doping' process may be achieved by injecting acceptor atoms into each silicon device. Appropriate acceptor atoms may include boron, aluminum or gallium, however other such atoms may be considered by those skilled in the art. The 'doped' p-type SONOS devices 401 may each have lowered or increased threshold voltage, in terms of absolute value, in a single direction, as described herein.

Figure 5:
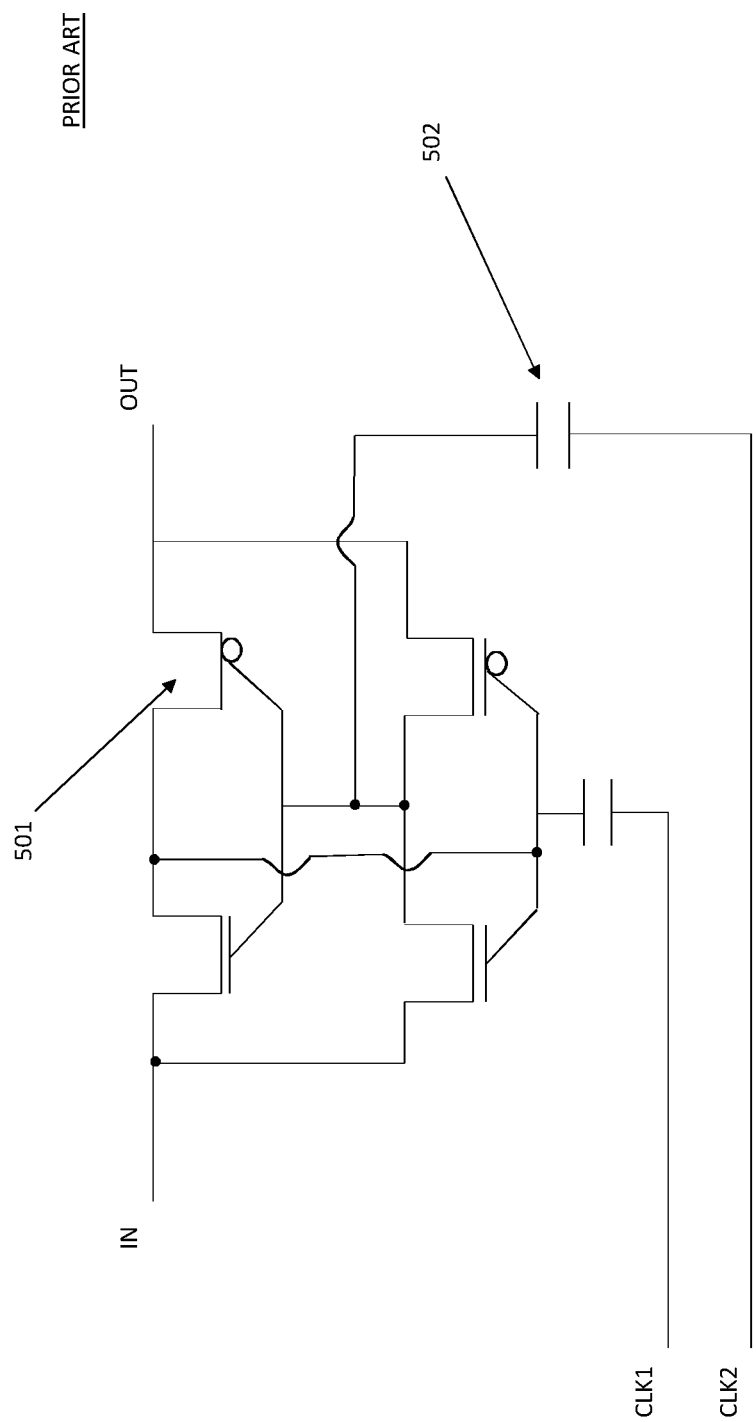
FIG. 5 depicts the circuit diagram of a standard single-stage cross-couple positive charge pump, in accordance with the prior art.

FIG. 5 depicts a standard single-stage cross-couple positive charge pump according to known prior art. Standard Dickson multipliers have typically been found in practice to have increasingly poor power conversion efficiency as input voltage decreases. This may be due to the voltage drop across diode-wired FETs becoming increasingly significant when compared to the output voltage of the circuit. In a cross-coupled circuit of the type depicted in FIG. 5, the transistors are typically not diode-wired and low voltages are accordingly dealt with more efficiently. In operation, the circuit may function by alternately switching 501 the output of each stage between a voltage doubler driven by CLK1 and another driven by CLK2. Capacitors in the circuit 502 may be sequentially charged and the circuit is generally operable to provide up to an ideal output of 2VSUP from each side of the circuit. It will be appreciated by those skilled in the art that a negative single-stage cross-couple charge pump will be similar to that of FIG. 5, aside from the source of the p-type MOS devices possibly being connected to the input, and the n-type MOS devices possibly being connected to the output.

Figure 6:
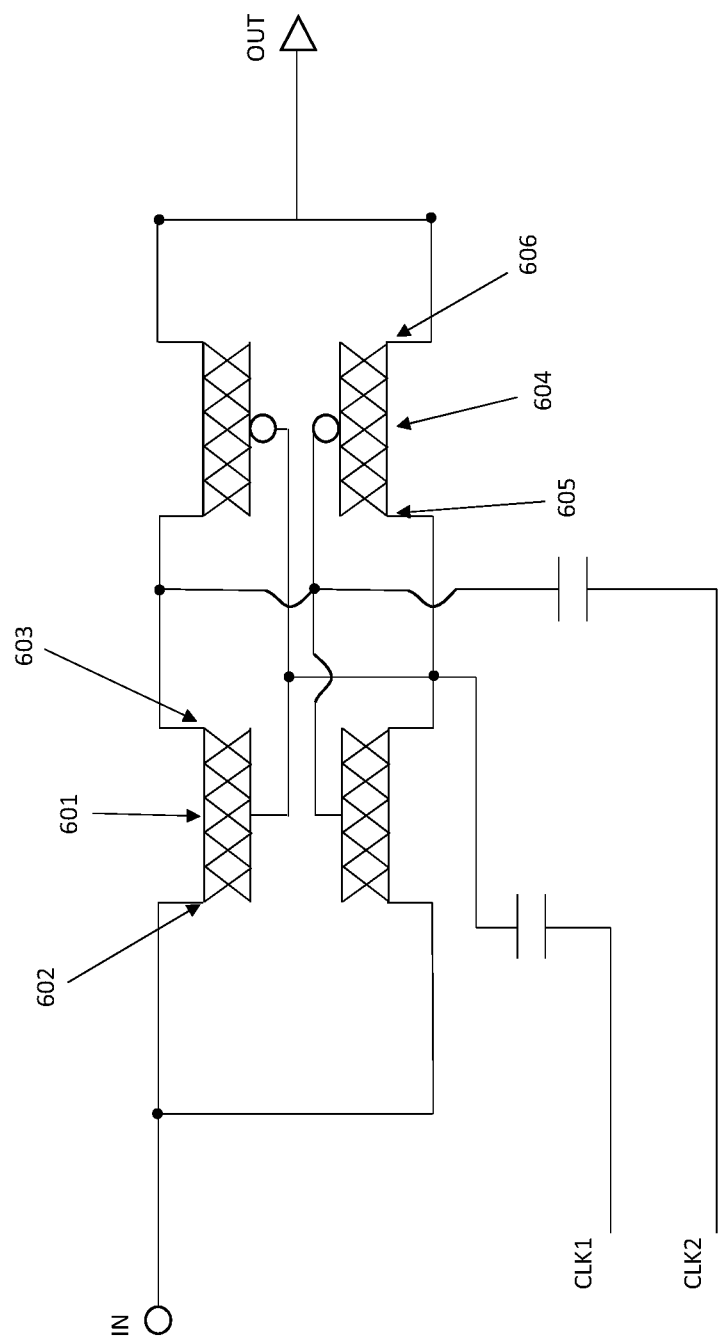
FIG. 6 shows an example of a circuit diagram depicting a single stage positive cross-couple SONOS directional multiplier according to an embodiment of the present invention.

FIG. 6 shows a single stage positive cross-couple SONOS multiplier according to an embodiment of the invention. The depicted cross-couple SONOS multiplier may feature a directionally altered threshold voltage, as described herein. It will be appreciated that this exemplary cross-couple SONOS multiplier may feature two p-type 601 and two n-type 604 SONOS devices, where each SONOS device may be interfaced with the circuitry of FIG. 2. The n-type 601 SONOS devices may each comprise source 602 and drain 603 regions. The p-type 604 SONOS devices may similarly each comprise source 605 and drain 606 regions. It will be appreciated by those skilled in the art that a negative cross-couple SONOS multiplier may be created with minor modifications to the layout depicted in FIG. 6.

Figure 7:
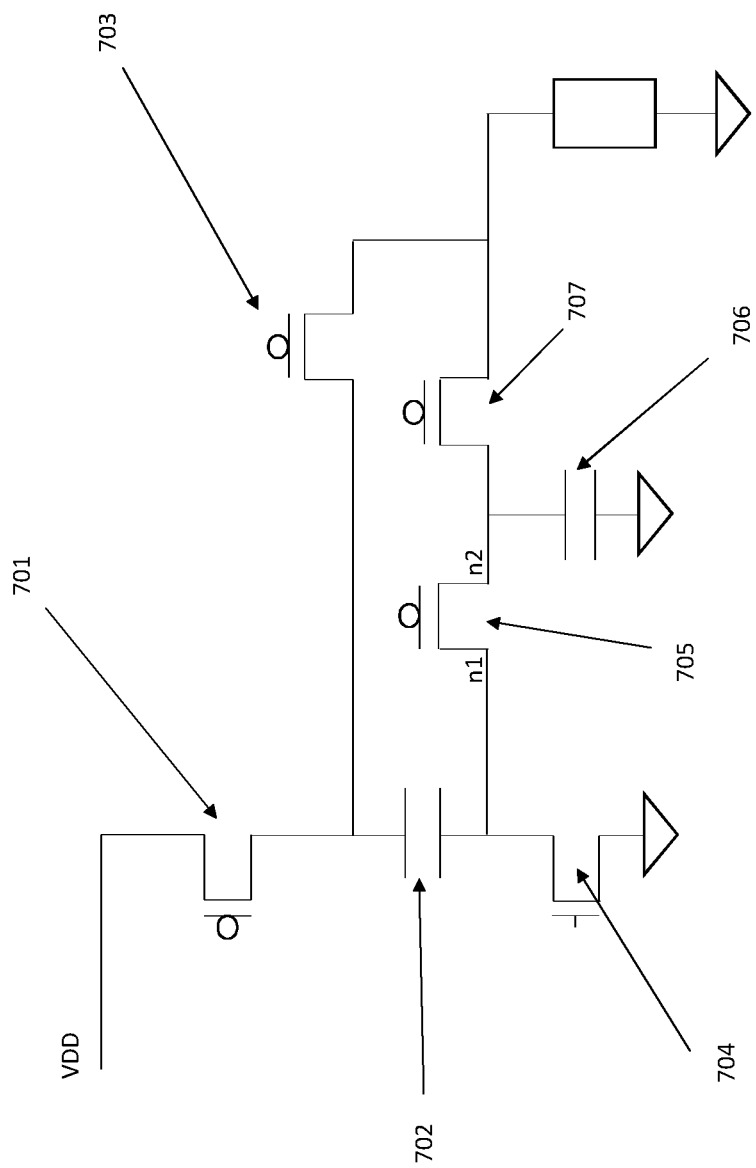
FIG. 7 depicts the circuit diagram of a standard half-gain step-down charge pump, in accordance with the prior art.

FIG. 7 illustrates a standard half-gain step-down charge pump according to known prior art where the clock circuitry is not shown. It will be appreciated by those skilled in the art that a step-down charge pump may be operable to step down voltage, while also stepping up current from an input supply to its output load. Broadly, the illustrated circuit may comprise MPCHRGH 701, capacitor CH 702, MPCH_LOAD 703, MNGND_CH 704, MPCHRGLOW 705, capacitor CLOW 706 and MLOW_LOAD 707. When the charge-pump is charging, node n1 may have a higher voltage than node n2 and device MPCHRGLOW 705 may act to short the two by allowing node n2 to be made as close as possible to node n1. During the discharge or load driving stage, node n1 may be driven to ground while node n2 may be held significantly above 0 and as close to VDD/2 as possible. As is typically the case with step-up charge pumps, the same leakage predicament may arise in step-down charge pumps. Where the threshold voltage of MPCHRGLOW 705 is minimized, there may be a decrease in the W/L required, but there may also be exponentially more leakage during the other charge-pump phase.

Figure 8:
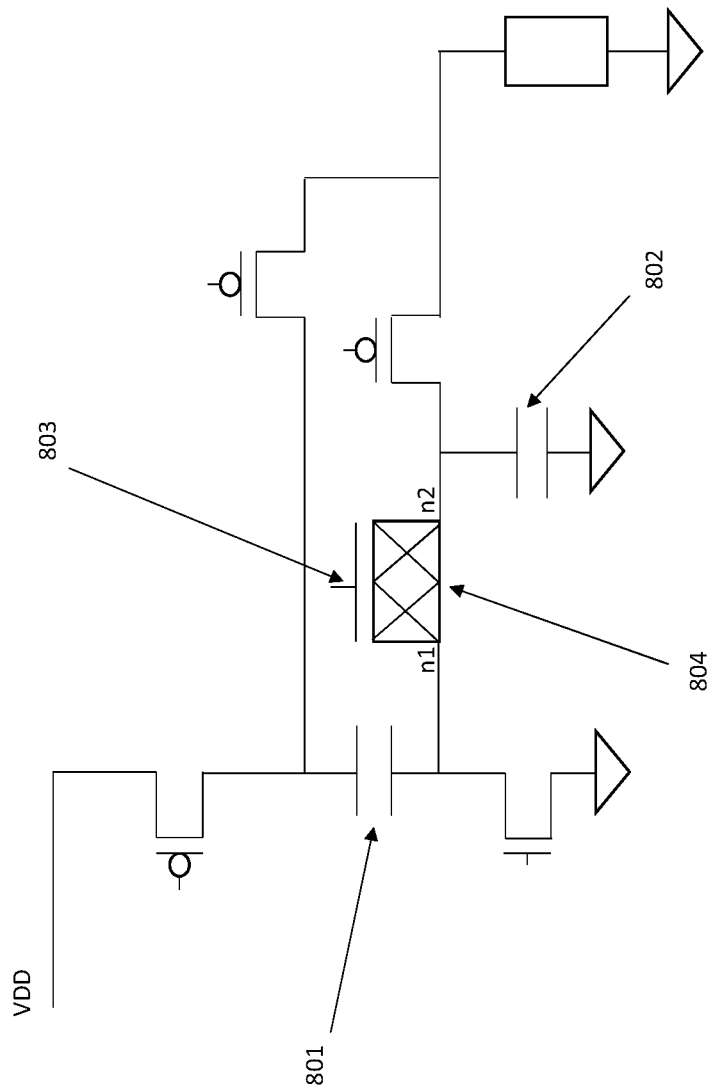
FIG. 8 is a circuit diagram illustrating an example of a circuit diagram depicting a SONOS directional step-down multiplier according to an embodiment of the present invention.

FIG. 8 shows an example of a SONOS directional step-down multiplier according to an embodiment of the invention where clock circuitry is not shown. It will be appreciated by those skilled in the art that while the depicted step-down multiplier may be a half-gain variant analogous to the circuit depicted in FIG. 7, the techniques disclosed herein may be equally applicable to step-down multipliers of other gain ratios. The illustrated circuit depicts a 'doped' SONOS device 804, usually of p-type, positioned between capacitors CH 801 and CLOW 802, where the SONOS device 804 may have a connection 803 to added circuitry of the type shown in FIG. 2. As the threshold voltage is lower on side n1, conduction from side n1 to side n2 may be efficient during charging. There may also be a reduction in leakage when side n2 is higher than side n1, possibly resulting in a significant cumulative increase in the overall efficiency of the circuit.

Figure 9:
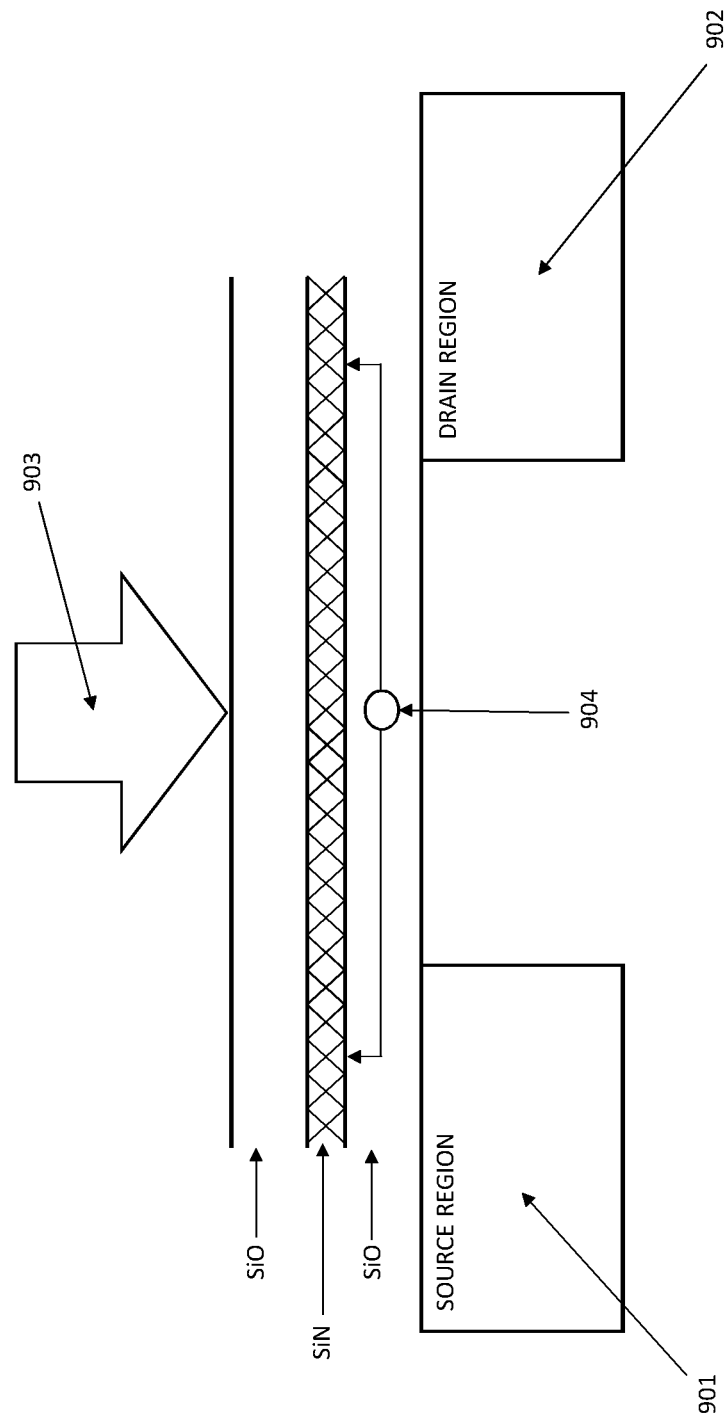
FIG. 9 depicts an example of architecture for a SONOS device according to embodiments of the invention.

FIG. 9 illustrates an example of architecture for a SONOS device according to embodiments of the invention. The example SONOS device may comprise a silicon nitride (SiN) layer disposed between two silicon oxide (SiO) layers; a source region 901; a drain region 902; a voltage 903 applied to a gate region; and an electron or hole 904. Various combinations of very high or low positive or negative voltages may be applied to the gate 903, source 901, and drain 902 regions of the SONOS device to force electrons or holes 904 to tunnel through an oxide layer and possibly become trapped in the silicon nitride layer. Depending on the voltage/polarity combination used, electrons or holes may be encouraged to accumulate proximate to the source 901 and/or drain 902 region thereby typically altering the threshold voltage of the SONOS device in a single direction (i.e. in the direction of the source 901 or drain 902 region). Following alteration of the threshold voltage in a single direction, the SONOS device may be run in a normal or high efficiency mode to achieve optimal results and obtain the corresponding power and cost savings/reduction. It will be appreciated by those skilled in the art that electrons or holes may tunnel into the silicon nitride layer via the physical process known as hot channel/hot carrier injection (HCI).

Further, it will be appreciated by those skilled in the art that in some embodiments the threshold voltage of the SONOS device may be increased in one direction during an initial pass, and decreased in the opposite direction during a subsequent pass. In such embodiments, both the initial pass and subsequent pass may be cumulative in effect and may act to adjust the threshold voltage in a single direction. Accordingly, the invention is not limited to the accumulation of either electrons or holes, and embodiments exist where both electrons and holes may be accumulated simultaneously.

Figure 10:
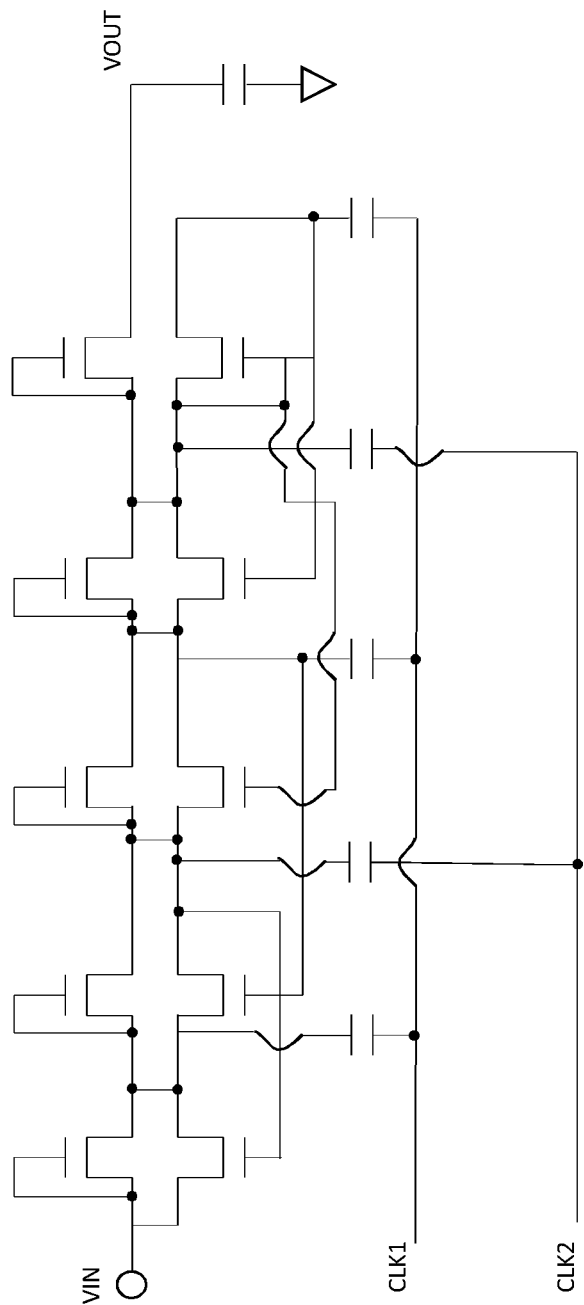
FIG. 10 shows an example of a circuit diagram depicting a typical charge pump with a linear shunt transistor, in accordance with the prior art.
Figure 11:
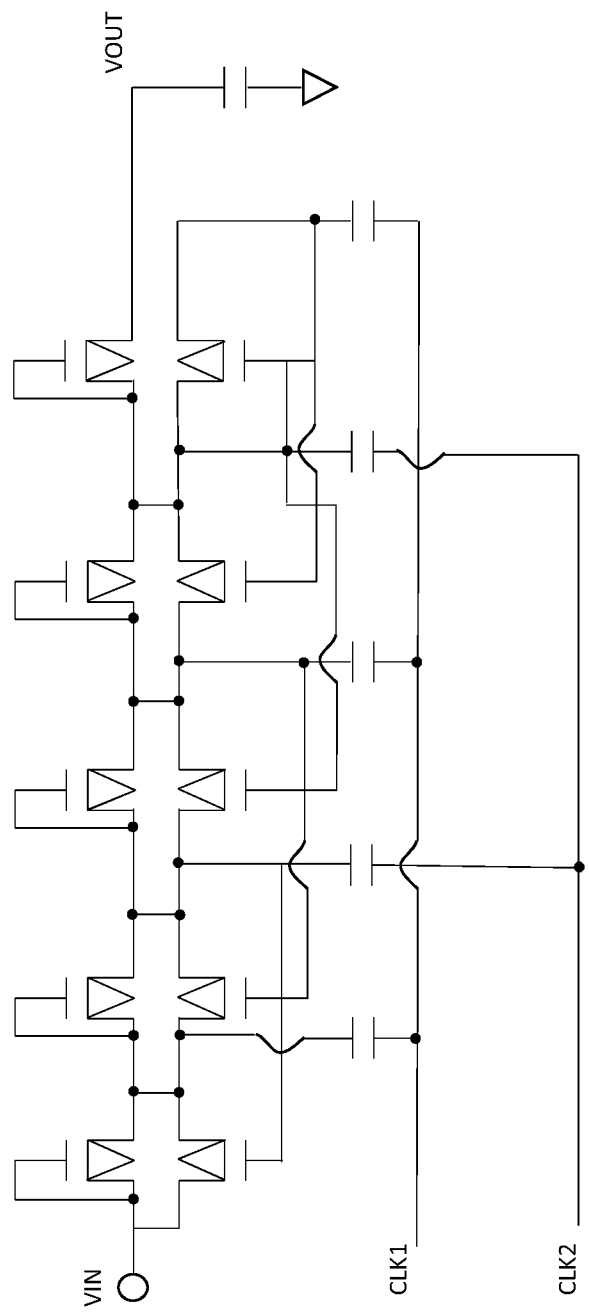
FIG. 11 shows an example of a circuit diagram depicting a SONOS charge pump with a linear shunt transistor according to an embodiment of the present invention.

FIG. 10 shows an example of a charge pump with a linear shunt transistor in accordance with known prior art. FIG. 11 shows an example of a SONOS charge pump with a linear shunt transistor according to embodiments of the invention.

Figure 12:
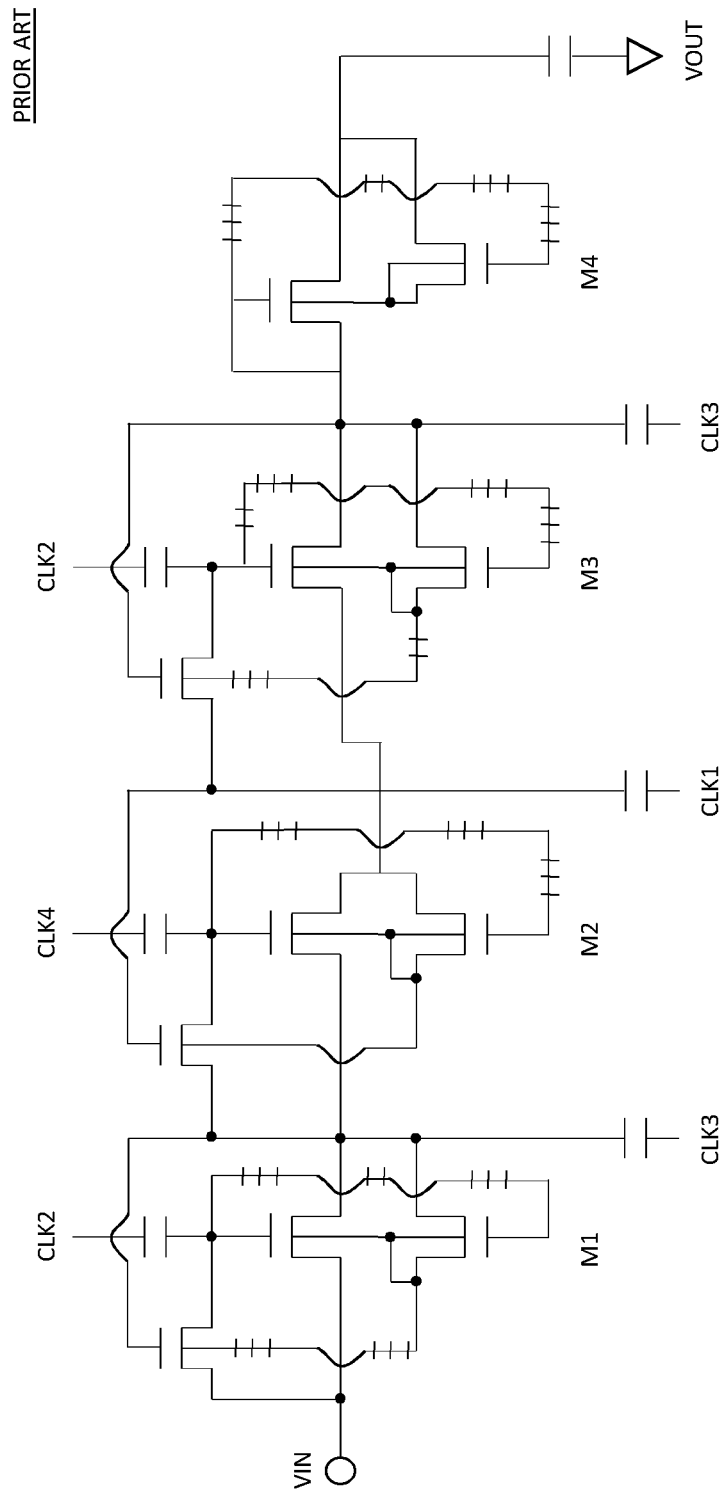
FIG. 12 shows an example of a circuit diagram depicting a 3-stage normal charge pump with body-biasing safety and threshold voltage degradation effect, in accordance with the prior art.
Figure 13:
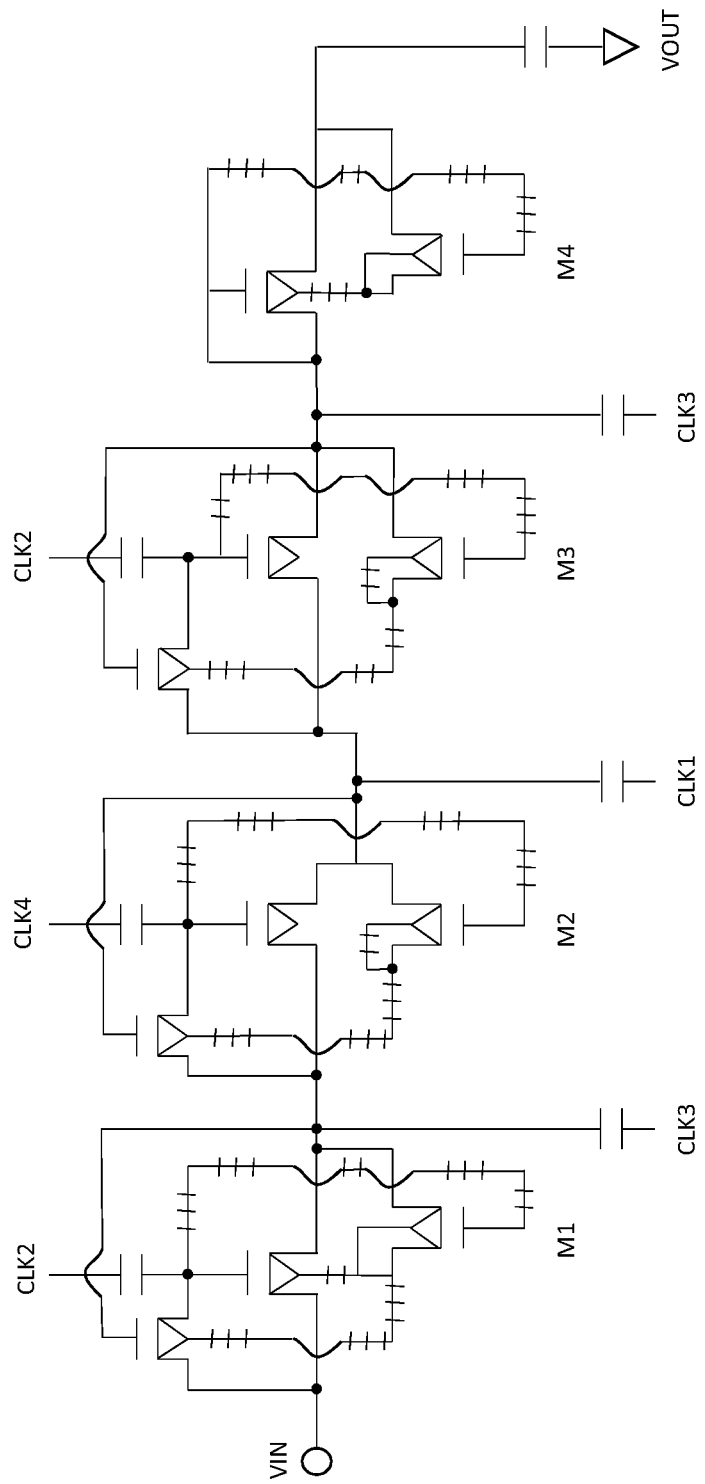
FIG. 13 shows an example of a circuit diagram depicting a 3-stage SONOS charge pump with body-biasing safety and threshold voltage degradation effect according to an embodiment of the present invention.
Figure 14:
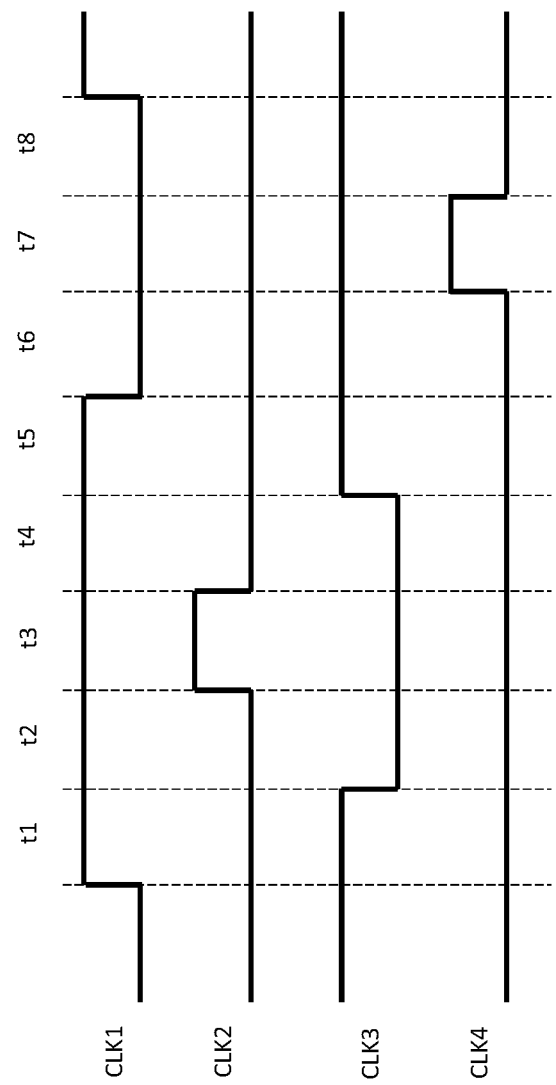
FIG. 14 shows an example of a clock timing scheme for a 3-stage SONOS charge pump with body-biasing safety and threshold voltage degradation effect according to an embodiment of the present invention.

FIG. 12 shows an example of a 3-stage normal charge pump with body-biasing safety and threshold voltage degradation effect in accordance with known prior art. FIG. 13 shows an example of a non-3-stage SONOS charge pump with body-biasing safety and threshold voltage degradation effect according to embodiments of the invention. It will be appreciated by those skilled in the art that regions denoted by labels M1, M2, M3 and M4, and regions denoted by dashing may have undergone threshold voltage alteration/cancellation. FIG. 14 shows an example of a clock timing scheme for a 3-stage SONOS or prior art charge pump with body-biasing safety and threshold voltage degradation effect according to the invention.

According to some embodiments of the invention, n-type SONOS devices may be run under a program mode of operation to increase threshold voltage, and may further be run under an erasure mode of operation to decrease threshold voltage. According to some embodiments of the invention, p-type SONOS devices may be run under a program mode of operation to decrease threshold voltage, and may further be run under an erasure mode of operation to increase threshold voltage.

According to some embodiments of the invention, n-type SONOS run under a program mode of operation may comprise the tunneling of electrons to an edge/side (source/drain) of said n-type SONOS device. This edge/side may, under a normal/high efficiency mode of operation, receive a low voltage and may conduct less than prior to running said program mode of operation. The pulse type required for said program mode of operation to trigger accumulation of electrons at said drain region may comprise: a pulse of high gate voltage, low source voltage, and high drain voltage. The pulse type required for said program mode of operation to trigger accumulation of electrons at said source region may comprise: a pulse of high gate voltage, high source voltage, and low drain voltage.

According to some embodiments of the invention, n-type SONOS run under an erasure mode of operation may comprise the tunneling of holes to an edge/side (source/drain) of said n-type SONOS device. This edge/side may, under a normal/high efficiency mode of operation, receive a low voltage and may conduct better than prior to running said program mode of operation. The pulse type required for said erasure mode of operation to trigger accumulation of holes at said drain region may comprise: a pulse of negative gate voltage, high source voltage, and low drain voltage. The pulse type required for said erasure mode of operation to trigger accumulation of holes at said source region may comprise: a pulse of negative gate voltage, low source voltage, and high drain voltage.

According to some embodiments of the invention, p-type SONOS run under a program mode of operation may comprise the tunneling of holes to an edge/side (source/drain) of said p-type SONOS device. This edge/side may, under a normal/high efficiency mode of operation, receive a high voltage and may conduct less than prior to running said program mode of operation. The pulse type required for said program mode of operation to trigger accumulation of holes at said drain region may comprise: a pulse of negative gate voltage, high source voltage, and low drain voltage. The pulse type required for said program mode of operation to trigger accumulation of holes at said source region may comprise: a pulse of low gate voltage, low source voltage, and high drain voltage.

According to some embodiments of the invention, p-type SONOS run under an erasure mode of operation may comprise the tunneling of electrons to an edge/side (source/drain) of said p-type SONOS device. This edge/side may, under a normal/high efficiency mode of operation, receive a low voltage and will conduct better than prior to running said program mode of operation. The pulse type required for said erasure mode of operation to trigger accumulation of electrons at said drain region may comprise: a pulse of positive gate voltage, low source voltage, and high drain voltage. The pulse type required for said erasure mode of operation to trigger accumulation of electrons at said source region may comprise: a pulse of positive gate voltage, high source voltage, and low drain voltage.

According to some embodiments, several pulses may be required to achieve the desired directional threshold voltage. After each pulse, the resultant threshold voltage may be observed using known methods. Such known methods may include observing internal resistance (IR) drop versus reference values, or observing load time of the capacitor versus reference values. It will be appreciated by those skilled in the art that the values (biases, temperature, and time length) may be process-dependent and may vary significantly.

According to some embodiments, the DC-to-DC converter may be run in a mode of operation comprising the absence of a directional threshold voltage having been applied. It will however be appreciated by those skilled in the art that such a mode of operation may be less efficient, may require more drive power and/or may require a higher area. It will further be appreciated by those skilled in the art that a directional alteration to threshold voltage may imply or may be equivalent to an asymmetrical threshold voltage.

According to some embodiments, the DC-to-DC converter may comprise said at least one SONOS device, wherein said at least one SONOS device may be doped to comprise a dominant carrier concentration. According to further embodiments, said at least one SONOS device may comprise a source, gate, drain, bulk and channel region.

According to some embodiments, the DC-to-DC converter may further comprise circuitry connected to the at least one SONOS device, said circuitry comprising at least one multiplexer operably connected to at least the gate region of the at least one SONOS device.

According to some embodiments, the DC-to-DC converter may comprise circuitry wherein said circuitry may be operable to switch said DC-to-DC converter between a plurality of modes of operation, and wherein at least two of said modes of operation may alter the threshold voltage of said at least one SONOS device.

According to some embodiments, said plurality of modes of operation may include a program mode and an erasure mode of operation, and wherein while said program or said erasure mode of operation is active, electrons or holes in said channel region may tunnel through an oxide layer (SiO), may become trapped in silicon nitride (SiN) and may accumulate proximate to said source and/or said drain region of said at least one SONOS device.

According to some embodiments, said plurality of modes of operation may include a high efficiency mode of operation, and wherein said high efficiency mode of operation may be enabled following accumulation of electrons or holes proximate to said source and/or said drain region of said at least one SONOS device.

According to some embodiments, said DC-to-DC converter may comprise at least one n-type or p-type SONOS device, and wherein at least one of said plurality of modes of operation may comprise the steps of: a) for n-type SONOS, applying a high voltage on said source and said gate region thereby possibly increasing threshold voltage on said drain region of said at least one n-type SONOS device; b) for n-type SONOS, applying a high voltage on said drain and said gate region thereby possibly increasing threshold voltage on said source region of said at least one n-type SONOS device; c) for n-type SONOS, applying a negative voltage on said gate region, and applying a high voltage on said source region, thereby possibly decreasing threshold voltage on said drain region of said at least one n-type SONOS device; d) for n-type SONOS, applying a negative voltage on said gate region, and applying a high voltage on said drain region, thereby possibly decreasing threshold voltage on said source region of said at least one n-type SONOS device; e) for p-type SONOS, applying a negative voltage on said source and said gate region thereby possibly increasing threshold voltage on said drain region of said at least one p-type SONOS device; f) for p-type SONOS, applying a negative voltage on said drain and said gate region thereby possibly increasing threshold voltage on said source region of said at least one p-type SONOS device; g) for p-type SONOS, applying a positive voltage on said gate region, and applying a negative voltage on said source region, thereby possibly decreasing threshold voltage on said drain region of said at least one p-type SONOS device; and, h) for p-type SONOS, applying a positive voltage on said gate region, and applying a negative voltage on said drain region, thereby possibly decreasing threshold voltage on said source region of said at least one p-type SONOS device. It will be appreciated by those skilled in the art that for n-type SONOS, 'high voltage' may refer to voltages in a 5 to 7 volt range, and 'negative voltage' may refer to voltages in a −5 to −7 volt range. It will also be appreciated by those skilled in the art that for p-type SONOS, 'negative voltage' may refer to voltages in a −10 to −12 volt range, and 'positive voltage' may refer to voltages in a 5 to 7 volt range. Further, it will be appreciated by those skilled in the art that collective references to 'high voltage', 'low voltage', 'negative voltage', and/or 'positive voltage' may not necessitate precisely the same voltage level being applied in respect of all references. For example, a 'high voltage' applied to a source region and a gate region may entail a voltage of 6 volts applied on the source region and a voltage of 7 volts applied on the gate region, or vice versa.

According to some embodiments, said at least one SONOS device may comprise a polysilicon metal-oxide-semiconductor field-effect transistor (MOSFET), said MOSFET possibly further comprising a quantity of silicon nitride inserted therein.

According to some embodiments, said DC-to-DC converter may include no metal-oxide-semiconductor (MOS) devices.

According to some embodiments, the or each multiplexer may be operable to protect against voltages applied to one or more of said gate, said source, said bulk, or said drain region that are too high or low. It will be appreciated by those skilled in the art that 'too high voltages' may refer to voltages in a 9 to 16 volt range. It will also be appreciated by those skilled in the art that 'too low voltages' may refer to voltages in a −9 to −14 volt range.

According to some embodiments, the circuitry may further comprise at least one auxiliary charge-pump, said at least one auxiliary charge-pump possibly being operable to drive said at least one multiplexer.

According to some embodiments, said at least one auxiliary charge-pump may comprise at least one secondary SONOS device operable to perform voltage multiplication, and wherein said at least one secondary SONOS device may be doped and comprise a dominant carrier concentration.

According to some embodiments, said DC-to-DC converter may be a step-down converter with a multiplication coefficient less than one or negative, and wherein said DC-to-DC converter may be operable to decrease voltage.

According to some embodiments, said DC-to-DC converter may be a step-up converter with a multiplication coefficient greater than one, and wherein said DC-to-DC converter may be operable to increase voltage.

According to some embodiments, said DC-to-DC converter may be a buck-boost converter with a selectable multiplication coefficient, and wherein said DC-to-DC converter may be operable to increase or decrease voltage.

According to some embodiments, said at least one SONOS device may be an n-type depletion, native or enhancement SONOS device.

According to some embodiments, said at least one SONOS device may be an p-type depletion, native or enhancement SONOS device.

According to some embodiments, the or each clock signal may be boosted by SONOS/normal boosts.

According to some embodiments, a method of directionally altering the threshold voltage of at least one silicon-oxide-nitride-oxide-silicon (SONOS) device is disclosed, said method comprising at least one n-type or p-type SONOS device which may be operable in at least one of the following modes: a) for n-type SONOS, applying a high voltage on said source and said gate region thereby possibly increasing threshold voltage on said drain region of said at least one n-type SONOS device; b) for n-type SONOS, applying a high voltage on said drain and said gate region thereby possibly increasing threshold voltage on said source region of said at least one n-type SONOS device; c) for n-type SONOS, applying a negative voltage on said gate region, and applying a high voltage on said source region, thereby possibly decreasing threshold voltage on said drain region of said at least one n-type SONOS device; d) for n-type SONOS, applying a negative voltage on said gate region, and applying a high voltage on said drain region, thereby possibly decreasing threshold voltage on said source region of said at least one n-type SONOS device; e) for p-type SONOS, applying a negative voltage on said source and said gate region thereby possibly increasing threshold voltage on said drain region of said at least one p-type SONOS device; f) for p-type SONOS, applying a negative voltage on said drain and said gate region thereby possibly increasing threshold voltage on said source region of said at least one p-type SONOS device; g) for p-type SONOS, applying a positive voltage on said gate region, and applying a negative voltage on said source region, thereby possibly decreasing threshold voltage on said drain region of said at least one p-type SONOS device; and, h) for p-type SONOS, applying a positive voltage on said gate region, and applying a negative voltage on said drain region, thereby possibly decreasing threshold voltage on said source region of said at least one p-type SONOS device. It will be appreciated by those skilled in the art that for n-type SONOS, 'high voltage' may refer to voltages in a 5 to 7 volt range, and 'negative voltage' may refer to voltages in a −5 to −7 volt range. It will also be appreciated by those skilled in the art that for p-type SONOS, 'negative voltage' may refer to voltages in a −10 to −12 volt range, and 'positive voltage' may refer to voltages in a 5 to 7 volt range. Further, it will be appreciated by those skilled in the art that collective references to 'high voltage', 'low voltage', 'negative voltage', and/or 'positive voltage' may not necessitate precisely the same voltage level being applied in respect of all references. For example, a 'high voltage' applied to a source region and a gate region may entail a voltage of 6 volts applied on the source region and a voltage of 7 volts applied on the gate region, or vice versa.

According to some embodiments, the transistor, when diode connected (source or drain shorted with the gate), may serve as a substitute to the Schottky diode, which can be used anywhere when low-voltage diodes are needed. The barrier is the field from the trapped charges, and the gate voltage, when in reverse bias. It can be used to replace low-forward voltage on-chip diodes, such as in an inductive boost, in which the inductor and switching stage are separated from the output via a diode/other switching element. A diode connected SONOS transistor, or a switched one, controlled by another clock, may improve the efficiency and cost vs. a diode (less leakage current), by virtue of the effective asymmetrical Vt.

As will be appreciated by one skilled in the art, aspects of the invention may be embodied as a system or an apparatus. Accordingly, aspects of the invention may take the form of an entirely hardware embodiment or an embodiment combining software and hardware aspects that may all generally be referred to herein as a "circuit," "module" or "system."

The aforementioned figures illustrate the architecture, functionality, and operation of possible implementations of systems and apparatus according to various embodiments of the present invention. Where referred to in the above description, an embodiment is an example or implementation of the invention. The various appearances of "one embodiment," "an embodiment" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Reference in the specification to "some embodiments", "an embodiment", "one embodiment" or "other embodiments" means that a particular feature, structure, or characteristic described in connection with the embodiments is included in at least some embodiments, but not necessarily all embodiments, of the inventions. It will further be recognized that the aspects of the invention described hereinabove may be combined or otherwise coexist in embodiments of the invention.

It is to be understood that the phraseology and terminology employed herein is not to be construed as limiting and are for descriptive purpose only.

The principles and uses of the teachings of the present invention may be better understood with reference to the accompanying description, figures and examples.

It is to be understood that the details set forth herein do not construe a limitation to an application of the invention.

Furthermore, it is to be understood that the invention can be carried out or practiced in various ways and that the invention can be implemented in embodiments other than the ones outlined in the description above.

It is to be understood that the terms "including", "comprising", "consisting" and grammatical variants thereof do not preclude the addition of one or more components, features, steps, or integers or groups thereof and that the terms are to be construed as specifying components, features, steps or integers.

If the specification or claims refer to "an additional" element, that does not preclude there being more than one of the additional element.

It is to be understood that where the claims or specification refer to "a" or "an" element, such reference is not be construed that there is only one of that element.

It is to be understood that where the specification states that a component, feature, structure, or characteristic "may", "might", "can" or "could" be included, that particular component, feature, structure, or characteristic is not required to be included.

Meanings of technical and scientific terms used herein are to be commonly understood as by one of ordinary skill in the art to which the invention belongs, unless otherwise defined.

The present invention may be implemented in the testing or practice with methods and materials equivalent or similar to those described herein.

Any publications, including patents, patent applications and articles, referenced or mentioned in this specification are herein incorporated in their entirety into the specification, to the same extent as if each individual publication was specifically and individually indicated to be incorporated herein. In addition, citation or identification of any reference in the description of some embodiments of the invention shall not be construed as an admission that such reference is available as prior art to the present invention.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A direct current to direct current (DC-to-DC) converter, comprising:
   at least one silicon-oxide-nitride-oxide-silicon (SONOS) device operable to perform voltage multiplication, wherein said at least one SONOS device is doped to comprise a dominant carrier concentration, wherein said at least one SONOS device comprises a source, a gate, a drain, a bulk and a channel region; and
   a circuitry connected to the at least one SONOS device, said circuitry comprising at least one multiplexer connected to at least the gate of the at least one SONOS device.

2. The DC-to-DC converter according to claim 1, wherein said circuitry is operable to switch said DC-to-DC converter between a plurality of modes of operation, and wherein at least two of said modes of operation alter the threshold voltage of said at least one SONOS device.

3. The DC-to-DC converter according to claim 2, wherein said plurality of modes of operation include a program mode and an erasure mode of operation, and wherein while said program or said erasure mode of operation is active, electrons or holes in said channel region tunnel through an oxide layer (SiO), become trapped in silicon nitride (SiN) and accumulate proximate to said source region, said drain region, or any combination thereof of said at least one SONOS device.

4. The DC-to-DC converter according to claim 3, wherein said plurality of modes of operation include a high efficiency mode of operation, and wherein said high efficiency mode of operation is enabled following accumulation of electrons or holes proximate to said source and/or said drain region of said at least one SONOS device.

5. The DC-to-DC converter according to claim 3, wherein said at least one SONOS device is an n-type SONOS device or p-type SONOS device, and wherein at least one of said plurality of modes of operation comprises the steps of:
   a) for said n-type SONOS, applying a high voltage on said source and said gate region thereby increasing a threshold voltage on said drain region of said at least one n-type SONOS device;
   b) for said n-type SONOS, applying a high voltage on said drain and said gate region thereby increasing a threshold voltage on said source region of said at least one n-type SONOS device;
   c) for said n-type SONOS, applying a negative voltage on said gate region, and applying a high voltage on said source region, thereby decreasing a threshold voltage on said drain region of said at least one n-type SONOS device;
   d) for said n-type SONOS, applying a negative voltage on said gate region, and applying a high voltage on said drain region, thereby decreasing a threshold voltage on said source region of said at least one n-type SONOS device;
   e) for said p-type SONOS, applying a negative voltage on said source and said gate region thereby increasing a threshold voltage on said drain region of said at least one p-type SONOS device;
   f) for said p-type SONOS, applying a negative voltage on said drain and said gate region thereby increasing a threshold voltage on said source region of said at least one p-type SONOS device;
   g) for said p-type SONOS, applying a positive voltage on said gate region, and applying a negative voltage on said source region, thereby decreasing a threshold voltage on said drain region of said at least one p-type SONOS device;
   h) for said p-type SONOS, applying a positive voltage on said gate region, and applying a negative voltage on said drain region, thereby decreasing a threshold voltage on said source region of said at least one p-type SONOS device.

6. The DC-to-DC converter according to claim 1, wherein the at least one multiplexer is operable to protect against voltages applied to one or more of said gate, said source, said bulk, or said drain region that are too high or low.

7. The DC-to-DC converter according to claim 1, wherein said circuitry further comprises at least one auxiliary charge-pump, said at least one auxiliary charge-pump being operable to drive said at least one multiplexer.

8. The DC-to-DC converter according to claim 7, wherein said at least one auxiliary charge-pump comprises at least one secondary SONOS device operable to perform voltage multiplication, and wherein said at least one secondary SONOS device is doped and comprises a dominant carrier concentration.

9. The DC-to-DC converter according to claim 1, wherein said at least one SONOS device is an n-type depletion, native or enhancement SONOS device.

10. The DC-to-DC converter according to claim 1, wherein said at least one SONOS device is an p-type depletion, native or enhancement SONOS device.

11. The DC-to-DC converter according to claim 1, wherein said at least one SONOS device comprises a polysilicon metal-oxide-semiconductor field-effect transistor (MOSFET), said MOSFET further comprising a quantity of silicon nitride inserted therein.

12. The DC-to-DC converter according to claim 1, wherein said DC-to-DC converter includes no metal-oxide-semiconductor (MOS) devices.

13. The DC-to-DC converter according to claim 1, wherein said DC-to-DC converter is a step-down converter with a multiplication coefficient less than one or negative, and wherein said DC-to-DC converter is operable to decrease voltage.

14. The DC-to-DC converter according to claim 1, wherein said DC-to-DC converter is a step-up converter with a multiplication coefficient greater than one, and wherein said DC-to-DC converter is operable to increase voltage.

15. The DC-to-DC converter according to claim 1, wherein said DC-to-DC converter is a buck-boost converter with a selectable multiplication coefficient, and wherein said DC-to-DC converter is operable to increase or decrease voltage.

* * * * *